US011018666B1

United States Patent
Du et al.

(10) Patent No.: US 11,018,666 B1
(45) Date of Patent: May 25, 2021

(54) THYRISTOR CURRENT INTERRUPTER AND AUXILIARY QUASI-RESONANT TURN-OFF UNIT

(71) Applicant: ABB Schweiz AG, Baden (CH)

(72) Inventors: Yu Du, Raleigh, NC (US); Xiaoquing Song, Raleigh, NC (US); Yuzhi Zhang, Apex, NC (US); Adil Oudrhiri, Richmond, VA (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/795,988

(22) Filed: Feb. 20, 2020

(51) Int. Cl.
| | |
|---|---|
| *H03K 17/04* | (2006.01) |
| *H03K 17/13* | (2006.01) |
| *H03K 17/60* | (2006.01) |

(52) U.S. Cl.
CPC ......... *H03K 17/60* (2013.01); *H03K 17/0403* (2013.01); *H03K 17/136* (2013.01)

(58) Field of Classification Search
CPC .................. H03K 17/0403; H03K 17/136
USPC ................... 307/115, 125, 131; 327/438
See application file for complete search history.

(56) References Cited

U.S. PATENT DOCUMENTS

| | | | | |
|---|---|---|---|---|
| 4,107,551 | A * | 8/1978 | Akamatsu | H02M 1/06 327/440 |
| 7,459,804 | B2 | 12/2008 | Marwali et al. | |
| 7,589,438 | B2 | 9/2009 | Galm | |
| 8,508,890 | B2 | 8/2013 | Zheng et al. | |
| 2018/0091137 | A1 * | 3/2018 | Schneider | H03K 17/567 |

OTHER PUBLICATIONS

Cheng et al., Design of an Impulse Commutation Bridge for the Solid-State Transfer Switch, IEEE Transactions on Industry Applications, vol. 44, No. 4, Jul./Aug. 2008, pp. 1249-1258.
Meyer et al., Solid-State Circuit Breaker Based on Active Thyristor Topologies, IEEE Transactions on Power Electronics, vol. 21, No. 2, Mar. 2006, pp. 450-458.
International Searching Authority, International Search Report and Written Opinion issued in international application No. PCT/US2021/017842, dated Mar. 18, 2021, 8 pp.

* cited by examiner

*Primary Examiner* — William Hernandez
(74) *Attorney, Agent, or Firm* — Taft Stettinius & Hollister LLP

(57) ABSTRACT

An apparatus and method that can accelerate the turn off time for a thyristor current interrupter. Following commutation of a load current from a main thyristor to an auxiliary turn-off unit, a capacitor of the auxiliary turn-off unit can provide a resonant current to create a zero current crossing for turning the main thyristor off, as well as provide a reverse bias voltage for the main thyristor. The auxiliary turn-off unit can hold the main thyristor off and facilitate sufficient time being available for main thyristor to block forward system voltage. A voltage level of another capacitor of the auxiliary turn-off unit can, with a switch of the auxiliary turn-off unit and the main thyristor turned off, be increased to a level that triggers at least one voltage-clamping unit to absorb electrical power from that capacitor. The load current passing in the auxiliary turn-off unit can be decreased as the electrical power is absorbed to a level at which one or more auxiliary thyristor switches of the auxiliary turn-off unit can be turned off.

20 Claims, 9 Drawing Sheets

THYRISTOR CURRENT INTERRUPTER AND AUXILIARY QUASI-RESONANT TURN-OFF UNIT

FIELD OF INVENTION

The present invention relates to circuit interrupters, and more particularly, to thyristor current interrupters having auxiliary capabilities to force a resonant turn-off condition for a main thyristor.

BACKGROUND

Thyristors (SCRs), which can be used in a variety of power applications, can provide relatively high current capacity in a single package, and experience relatively low conduction power loss. Further, thyristors are generally readily available, and have proven reliability. Additionally, compared to at least some other types of power semiconductor switches, thyristors can be relatively inexpensive. However, traditionally, a disadvantage of using thyristors in the power applications has been a lack of controlled turn-off capability, which can result in a time delay before thyristors can interrupt an alternating current or a failure to interrupt a direct current. Moreover, compared to other semiconductor switches, thyristors typically have to wait for a current zero crossing, or the current to fall below a holding current, before the thyristor can be switched off, such as, for example, changing for being in a closed state to an open state.

Such delays in time before a thyristor can be switched off can create dangerous conditions, and can also cause damage to associated equipment and electrical components. For example, thyristors can be used as the main power switch for micro-grid disconnect switches that connect a utility grid with micro-grids having distributed generation, including photovoltaic farms, wind mills, energy storage systems, and/or diesel generators. In the event a power outage occurs as distributed generation continues to power the micro-grid, the micro-grid disconnect switch can be required to promptly isolate the micro-grid from the utility. However, with respect to micro-grid disconnect switches that utilize traditional thyristors, there can be a relatively long delay while waiting for current zero-crossing, or a drop in current below the holding current, to occur before the micro-grid disconnect switch can be switched off. Yet, during such a delay, the fault current or energy can grow to a relatively dangerous level that, at least in certain instances, can disable and take down an entire power network.

Thyristors can also be used as a static transfer switch (STS) in connection with transferring or toggling between power supply sources. Often, in response to detection of a power quality event, an STS can utilize a "break-before-make" approach for power source transfer. According to such an approach, upon detection of a power quality event, such as, for example, a power outage, fault, or other issue with the quality and/or supply of electrical power, a first, active thyristor switch can be used to isolate a main power source. For example, the first active thyristor switch can become inactive by the first active thyristor switch being switched from a closed state to an open state. However, again, such isolation can be delayed while the first active thyristor switch awaits for a current zero crossing or a drop in current below the associated holding current. Following the first active thyristor switch being opened, the second, inactive thyristor switch that is coupled to a secondary power source can be closed so as to become active. In at least some instances, the activation of the second thyristor can be delayed, such as, for example, due to downstream transformer flux matching and inrush current limits. Thus, the disconnection time associated with turning off the first thyristor switch,—can be a significant part of the total transfer time associated with switching from the main power source to the secondary power source. For example, the transfer gap between turning off the first, active thyristor switch and turning on the second, inactive thyristor switch can sometimes be a full electrical cycle. Such a relative long gap can challenge and interrupt the mission critical load, including, for example, downstream computer based servers and databases. Further, certain components of the load may also need to be configured to ensure continued operation of the equipment or components during such relatively long transfer times, such as, for example, in the form of additional and/or oversized capacitors, which can be costly.

Accordingly, although various current interrupters are available currently in the marketplace, further improvements are possible in the operation of thyristor current interrupters.

BRIEF SUMMARY

An aspect of an embodiment of the present application is an apparatus that can include a main thyristor having at least one main thyristor switch and an auxiliary turn-off unit that can be connected in parallel to the main thyristor. The auxiliary turn-off unit can include one or more pairs of auxiliary switches, a plurality of capacitors, a semiconductor switch, and at least one voltage-clamping unit. Additionally, each of the one or more pairs of auxiliary switches can include an auxiliary thyristor switch. The auxiliary turn-off unit can be structured to, upon the semiconductor switch being turned from a switch off state to a switch on state, commutate a load current from the main thyristor to a first pair of auxiliary switches of the one or more auxiliary switches and the semiconductor switch of the auxiliary turn-off unit. Further, at least one capacitor of the plurality of capacitors can be structured and positioned to, following commutation of the load current to the auxiliary turn-off unit, provide a resonant or quasi-resonant current to create a zero current crossing for the main thyristor to turn the main thyristor from a thyristor on state to a thyristor off state. Such a quasi-resonant current can relate to the resonance finishing in a fraction of the typical resonant time period due to a circuit state change. Additionally, at least another capacitor of the plurality of capacitors can be structured to, upon the switch being turned to the switch off state and with the main thyristor in the thyristor off state, have an increase in a voltage level. The at least one voltage-clamping unit can be structured to absorb electrical power from the at least another capacitor at least until the load current passing through the first pair of auxiliary switches is decreased to a level that can turn at least the auxiliary thyristor switch to an off state.

Another aspect of an embodiment of the present application is a thyristor current interrupter that can include a main thyristor having one or more main thyristor switches, and an auxiliary turn-off unit that can be connected in parallel to the main thyristor. The auxiliary turn-off unit can have at least a first switch, at least one auxiliary thyristor, a first capacitor, and a second capacitor. Further, the auxiliary turn-off unit can be structured at least to (1) commutate, upon the first switch being turned to an on state, a load current from the main thyristor to the auxiliary turn-off unit, (2) provide a resonant or quasi-resonant current to create a zero current crossing for the main thyristor, (3) increase, upon the first switch and the main thyristor both being turned to an off state, a voltage level of the first capacitor, and (4) decrease, upon the voltage level of the first capacitor reaching a threshold level, the load current in the auxiliary turn-off unit to a level that accommodates turning the at least one auxiliary thyristor to an off state.

Additionally, an aspect of an embodiment of the present application is a method that can include activating a switch and a plurality of auxiliary switches of an auxiliary turn-off unit of a thyristor current interrupter, the plurality of auxiliary switches including at least one auxiliary thyristor switch, and commutating a load current from a main thyristor of the thyristor current interrupter to the auxiliary turn-off unit, the main thyristor including at least one main thyristor switch. Further, a resonant current can be transmitted through at least a portion of the auxiliary turn-off unit in a manner that at least decreases the load current passing through the main thyristor. Additionally, the switch of the auxiliary turn-off unit can be deactivated, and, following deactivation of the switch, a voltage level of a first capacitor of the auxiliary turn-off unit can be increased. The method can also include one or more voltage-clamping units absorbing an electrical power from the first capacitor. Further, as the one or more voltage-clamping units absorb the electrical power, the load current in the auxiliary turn-off unit can be decreased. Further, upon the load current in the auxiliary turn-off unit either being reduced below a holding current or upon a current zero crossing, the at least one auxiliary thyristor switch of the auxiliary turn-off unit can be deactivated.

These and other aspects of the present invention will be better understood in view of the drawings and following detailed description.

BRIEF DESCRIPTION OF THE DRAWINGS

The description herein makes reference to the accompanying figures wherein like reference numerals refer to like parts throughout the several views.

Figure 1:
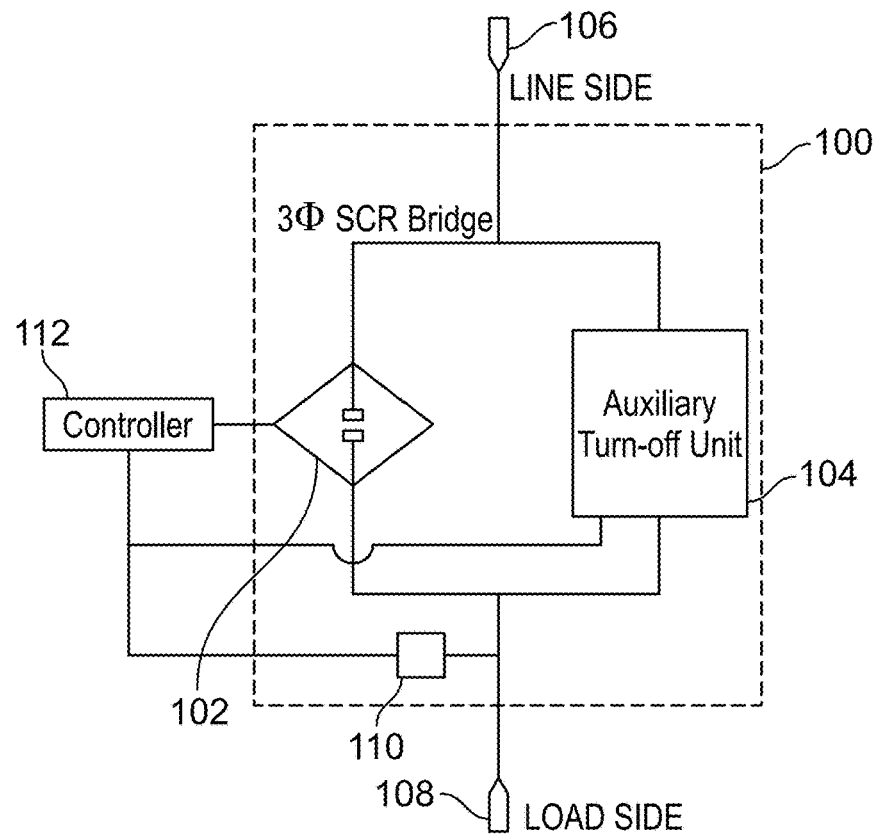
FIG. 1 illustrates a block diagram of an exemplary thyristor current interrupter switch according to an illustrated embodiment of the subject application.

The foregoing summary, as well as the following detailed description of certain embodiments of the present application, will be better understood when read in conjunction with the appended drawings. For the purpose of illustrating the application, there is shown in the drawings, certain embodiments. It should be understood, however, that the present application is not limited to the arrangements and instrumentalities shown in the attached drawings. Further, like numbers in the respective figures indicate like or comparable parts.

DESCRIPTION OF THE ILLUSTRATED EMBODIMENTS

Certain terminology is used in the foregoing description for convenience and is not intended to be limiting. Words such as "upper," "lower," "top," "bottom," "first," and "second" designate directions in the drawings to which reference is made. This terminology includes the words specifically noted above, derivatives thereof, and words of similar import. Additionally, the words "a" and "one" are defined as including one or more of the referenced item unless specifically noted. The phrase "at least one of" followed by a list of two or more items, such as "A, B or C," means any individual one of A, B or C, as well as any combination thereof.

FIG. 1 illustrates a block diagram of an exemplary thyristor current interrupter switch 100 according to an illustrated embodiment of the subject application. According to at least certain embodiments, the thyristor current interrupter switch 100 can be utilized as a disconnect switch. Moreover, the thyristor current interrupter switch 100 can be configured to interrupt the delivery of current passing through the thyristor current interrupter switch 100, and thus, for example, interrupt the supply of a current to a downstream load. According to the illustrated, the thyristor current interrupter 100 includes one or more main thyristors 102 that is/are connected in parallel to an auxiliary quasi-resonant turn-off unit 104.

As discussed below in more detail, the inclusion of the auxiliary turn-off unit 104 can accelerate the time in which the thyristor current interrupter 100 can interrupt the flow of current through the thyristor current interrupter 100 and/or to a load side of the thyristor current interrupter 100. Moreover, when the thyristor current interrupter 100 is operated to interrupt current, the auxiliary turn-off unit 104 can be activated. Such activation of the auxiliary turn-off unit 104, can facilitate current being commutate from the one or more main thyristors 102 to the auxiliary turn-off unit 104, thereby increasing the current in the auxiliary turn-off unit 104 while decreasing the current in the one or more main thyristors 102. By commutating current from the one or more main thyristors 102 to the auxiliary turn-off unit 104, the current level in the main thyristor(s) 102 can relatively quickly decrease to zero, or to a level below the associated holding current, in a relatively short time period, such as, for example, in about 10 microseconds (μs) to about 20 microseconds. Additionally, while facilitating a decrease in current in the main thyristor 102, the auxiliary turn-off unit 104 can apply a relatively small reverse bias voltage, such as, for example, a voltage of around 30 volts (V) to around 50 volts, to the main thyristor 102. While the duration of the application of the reverse bias voltage by the auxiliary turn-off unit 104 can vary, according to certain embodiments, the auxiliary turn-off unit 104 can apply the reverse bias voltage to the main thyristor 102 for about 150 microseconds (μs) to about 200 microseconds. Following application of the reverse bias voltage to the main thyristor 102, the main thyristor 102 can be in condition to be deactivated or turned off so as to at least no longer allow passage of forward voltage through the main thyristor 102. A switch of the auxiliary turn-off unit 104 can then be opened so that the auxiliary turn-off unit 104 can then also be turned off, thereby completing the opening of the thyristor current interrupter 100.

As shown in FIG. 1, power can be received by at a line side 106 of the thyristor current interrupter 100 and outputted to a load side 108 of the thyristor current interrupter 100. According to certain embodiments, current and/or voltage passing through the thyristor current interrupter 100 can be monitored at the load side 108 of the thyristor current interrupter 100, including, for example, via one or more sensors 110. For example, according to certain embodiments, a sensor 110 on the load side 110 of the thyristor current interrupter 100 can be a current sensor that monitors the current passing from, or out of, the thyristor current interrupter 100. Optionally, or alternatively, the sensor 110 can be a voltage sensor that monitors the voltage passing from, or out of, the thyristor current interrupter 100. Additionally, the sensor(s) 110 can be part of the thyristor current interrupter 100 and/or electrically coupled to the load side 108 of the thyristor current interrupter 100. Additionally, according to certain embodiments, current and/or voltage passing to the thyristor current interrupter 100 can be monitored at the line side 106 of the thyristor current interrupter 100, such as, for example, via one or more sensors.

As shown in FIG. 1, the thyristor current interrupter 100 can be communicatively coupled to a controller 112 that receives information from the one or more sensors of the thyristor current interrupter 100, including, for example, at least the sensor 110 on the load side 110 of the thyristor current interrupter 100. The controller 112 can be configured to utilize information provided to the controller 112 from the sensor(s) 110, among other information, when determining when to activate, as well as deactivate, each one of the main thyristor 102 and the auxiliary turn-off unit 104. According to certain embodiments, the controller 112 can include a processing device, such as, for example, a programmable, dedicated, and/or hardwired state machine, or any combination thereof. The processing device can include multiple processors, such as, for example, Arithmetic-Logic Units (ALUs), Central Processing Units (CPUs), Digital Signal Processors (DSPs), or the like. Processing devices with multiple processing units can also utilize distributed, pipelined, and/or parallel processing. The processing device may also be dedicated to performance of just the operations described herein or may be utilized in one or more additional applications.

In the depicted form, the processing device is of a programmable variety that executes algorithms and processes data in accordance with operating logic as defined by programming instructions (such as software or firmware) stored in a memory that is part of, or communicatively coupled to, the controller 112. Alternatively or additionally, the operating logic is at least partially defined by hardwired logic or other hardware. The processing device can include one or more components of any type suitable to process the signals received from, for example, the one or more sensors 110, among other devices, and to provide desired output signals, such as, for example, signals to the one or more main thyristors 102 and the auxiliary turn-off unit 104. Such components can also include digital circuitry, analog circuitry, or a combination of both.

The memory can be of one or more types, such as a solid-state variety, electromagnetic variety, optical variety, or a combination thereof. Additionally, the memory can be volatile, nonvolatile, or a combination thereof, and some or all of the memory can be of a portable variety, such as a disk, tape, memory stick, cartridge, or the like. In addition, according to certain embodiments, the memory can store data that is manipulated by the operating logic of processing device, such as data representative of signals received from and/or sent to the sensors 110, in addition to, or in lieu of, storing programming instructions defining the operating logic.

A variety of different types, configurations, and/or arrangements of thyristors can be utilized to provide the main thyristor(s) 102. For example, referencing FIG. 2, according to certain embodiments, the main thyristor 102 can be a bi-directional phase controlled thyristor comprising two thyristor switches, namely a first main thyristor switch 114a ($S_{m1}$), and a second main thyristor switch 114b ($S_{m2}$), arranged in an anti-parallel configuration. According to such embodiments, the main thyristor 102 can include a gate for each main thyristor switch 114a ($S_{m1}$), 114b ($S_{m2}$), one gate configured to turn on current in a forward direction, and the other gate turning on current flow in a reverse direction.

Figure 2:
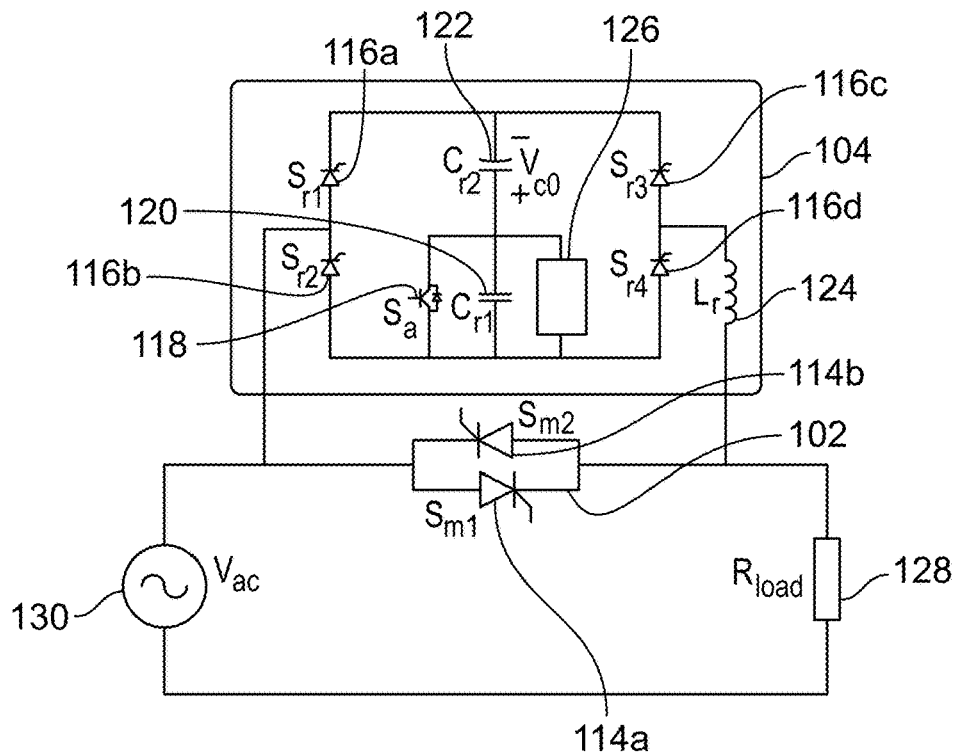
FIG. 2 illustrates a block diagram of an exemplary auxiliary turn-off unit and main thyristor of a thyristor current interrupter switch according to an illustrated embodiment of the subject application.

FIG. 2 also illustrates an exemplary embodiment of the auxiliary turn-off unit 104 for use with an alternating current (AC) power source 130. According to the illustrated embodiment, the auxiliary turn-off unit 104 includes a plurality of auxiliary thyristor switches 116a-d ($S_{r1}$-$S_{r4}$). Moreover, the illustrated auxiliary turn-off unit 104 includes a first pair of auxiliary thyristor switches, such as, for example, a first auxiliary thyristor switch 116a ($S_{r1}$) and a fourth auxiliary thyristor switch 116d ($S_{r4}$), and a second pair of auxiliary thyristor switches, such as, for example, a second auxiliary thyristor switch 116b ($S_{r2}$) and a third auxiliary thyristor switch 116c ($S_{r3}$). As shown by at least FIG. 2, according to at least applications in which alternating current (AC) power is delivered to the thyristor current interrupter 100, the auxiliary turn-off unit 104 can have a bridge configuration such that, during the positive half cycle of the AC current, the first pair of the auxiliary thyristor switches 116a, 116d ($S_{r1}$, $S_{r4}$) are forward biased, while the second pair of thyristor switches 116b, 116c ($S_{r2}$, $S_{r3}$) are forward biased during the negative half cycle of the AC current.

The auxiliary turn-off unit 104 can also include a semiconductor switch 118, and more specifically, a fully controlled semiconductor switch having full current turn-off capability, including, but not limited to, an insulated gate bipolar transfer (IGBT) switch, a gate turn-off (GTO) thyristor, an integrated gate-commutated thyristor (IGCT), a bipolar junction transistor (BJT), a metal-oxide-semiconductor field-effect transistor (MOSFET), and a junction field-effect transistor (JFET) based on various semiconductor technologies such as silicon (Si), silicon-carbide (SiC), gallium-nitride (GaN), to name but a few examples. Thus, while the illustrated embodiment the semiconductor switch 118 is depicted and described below in connection with use of an IGBT ($S_a$) as the semiconductor switch 118, other types of semiconductor switches can also be used. Additionally, the auxiliary turn-off unit 104 can further include a first, high voltage resonant capacitor 120 ($C_{r1}$), a second, low voltage resonant capacitor 122 ($C_{r2}$), a resonant inductor 124 ($L_r$), and a voltage-clamping unit 126. The resonant inductor 124 is positioned and configured to limit the rate of rise of the current. According to certain embodiments, the resonant inductor 124 can, for example, be, or include, a length of cable or wire that connects the auxiliary turn-off unit 104 to the main thyristor 102, and which utilizes the inductance of the wire or cable to limit the rate of rise of current.

The configuration of the auxiliary turn-off unit 104 can allow the auxiliary turn-off unit 104 to be an add-on module to the thyristor current interrupter 100 that may not alter the mechanical structure, cooling, and/or electrical clamping connection of the one or more main thyristors 102. Additionally, as the auxiliary turn-off unit 104 does not continuously conduct current, the auxiliary turn-off unit 104 may not generate additional power loss, and can be used with relatively low-cost discrete thyristors and IGBT switches with relatively good pulse capacity. Additionally, the resonant inductance of the auxiliary turn-off unit 104 can be relatively small.

While FIG. 2 illustrates an embodiment of a thyristor current interrupter 100 for use with an AC power source 130, the thyristor current interrupter 100 can also be configured for use with a direct current (DC) power source, as well as other current sources. For example, the thyristor current interrupter 100 depicted in FIG. 2 can also be used in bi-directional current applications, including bi-directional current applications that utilize a DC power source. Additionally, while FIG. 2 illustrates a thyristor current interrupter 100 for single phase current, a thyristor current interrupter 100 can be used for each phase in multiphase applications. For example, with respect to three phase applications, a separate thyristor current interrupter 100 can be utilized for each phase, with each thyristor current interrupter 100 having a main thyristor 102 and an auxiliary turn-off unit 104.

Additionally, as shown in FIG. 2, according to certain embodiments, the auxiliary IGBT switch 118, the first, high voltage resonant capacitor 120, and the voltage-clamping unit 126 are connected in parallel to each other. Further, a variety of different types of devices or components can be utilized as the voltage-clamping unit 126, such as, for example, one or more metal oxide varistors (MOV), including, but not limited to, a plurality of MOVs arranged in parallel with each other.

The second, low voltage resonant capacitor 122 can be pre-charged to a relatively low voltage, and can provide a resonant current to create a zero current crossing for the main thyristor 102. The second, low voltage resonant capacitor 122 can also be configured to, after load current has been transmitted to the auxiliary turn-off unit 104, provide a reverse bias voltage through the auxiliary IGBT switch 118 to hold off the main thyristor 102, as well as provide time for the main thyristor 102 to finish an internal carrier recombination process before the main thyristor 102 can block forward system voltage. The auxiliary IGBT switch 118 can then be turned off, and load current can then commutate from the auxiliary IGBT switch 118 to the first, high voltage resonant capacitor 120. The second resonance can then start, and the first, high voltage resonant capacitor 120 can limit the rate of voltage change of the main thyristor 102 so as to prevent the main thyristor 102 from being triggered on again in response to an occurrence in a relatively high rate of voltage change. When the voltage of the first, high voltage resonant capacitor 120 reaches a sufficient level, including, for example, a level at which the voltage of the first, high voltage resonant capacitor 120 is possibly limited by the parallel voltage-clamping unit 126, the load current can be decreased to zero or interrupted. The auxiliary thyristor switches 116a-d can then be reversed biased and turned off, such as, for example, via operation of the controller 112, and current interruption by the thyristor current interrupter 100 can be completed. According to certain embodiments, the total time for current interruption by the thyristor current interrupter 100 can be less the 350 microseconds (µs).

Figure 3:
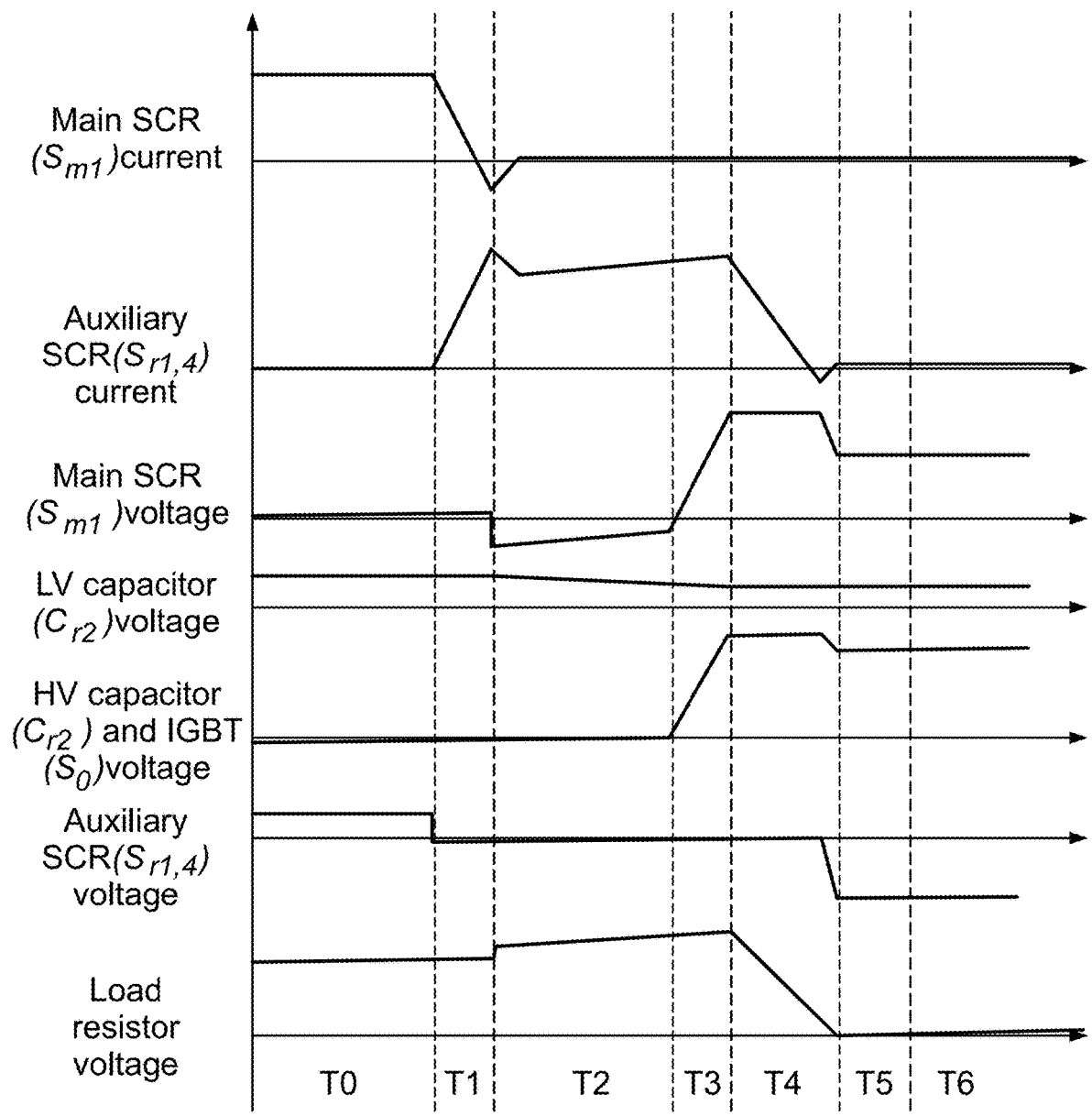
FIG. 3 illustrates a graphical representation of various aspects of an exemplary operation process for a thyristor current interrupter switch according to an illustrated embodiment of the subject application.
Figure 4B:
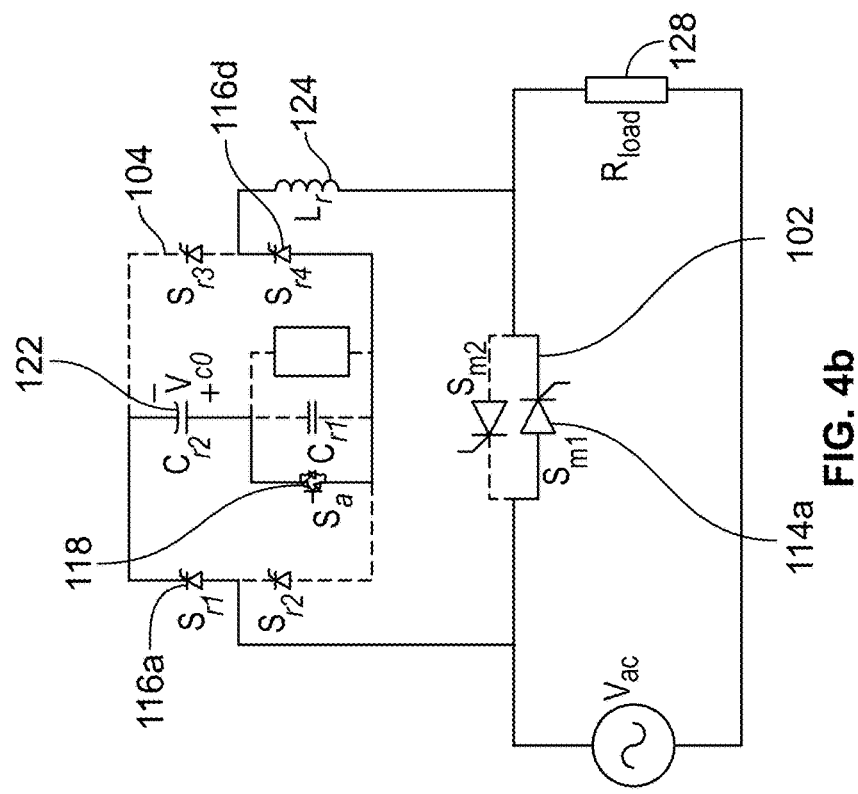
FIGS. 4a-4f illustrates various control and operation states of a thyristor current interrupter switch according to an illustrated embodiment of the subject application during the exemplary operation process depicted in FIG. 3.
Figure 4A:
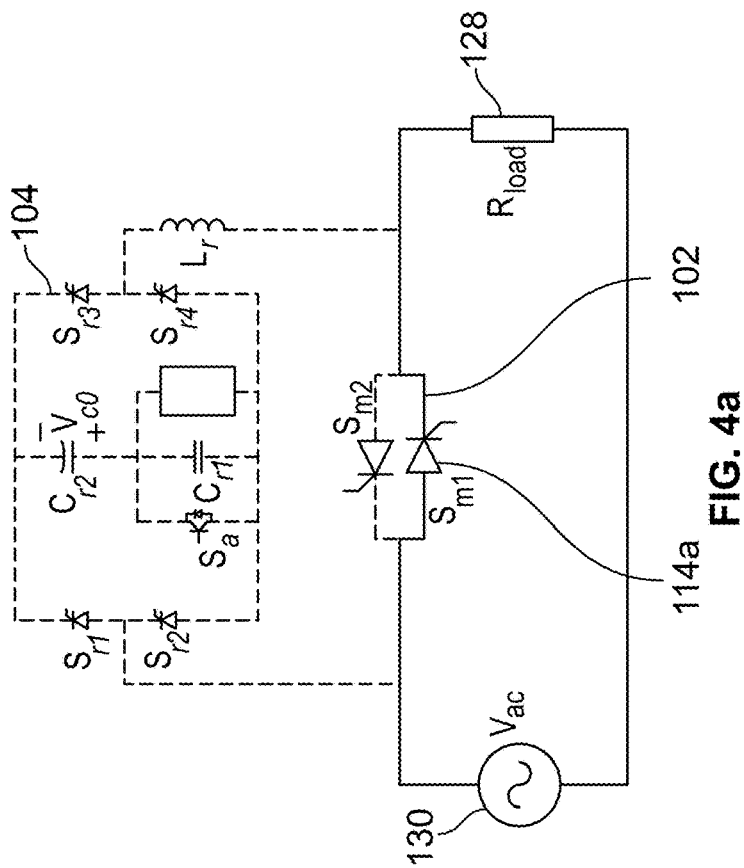
Figure 4D:
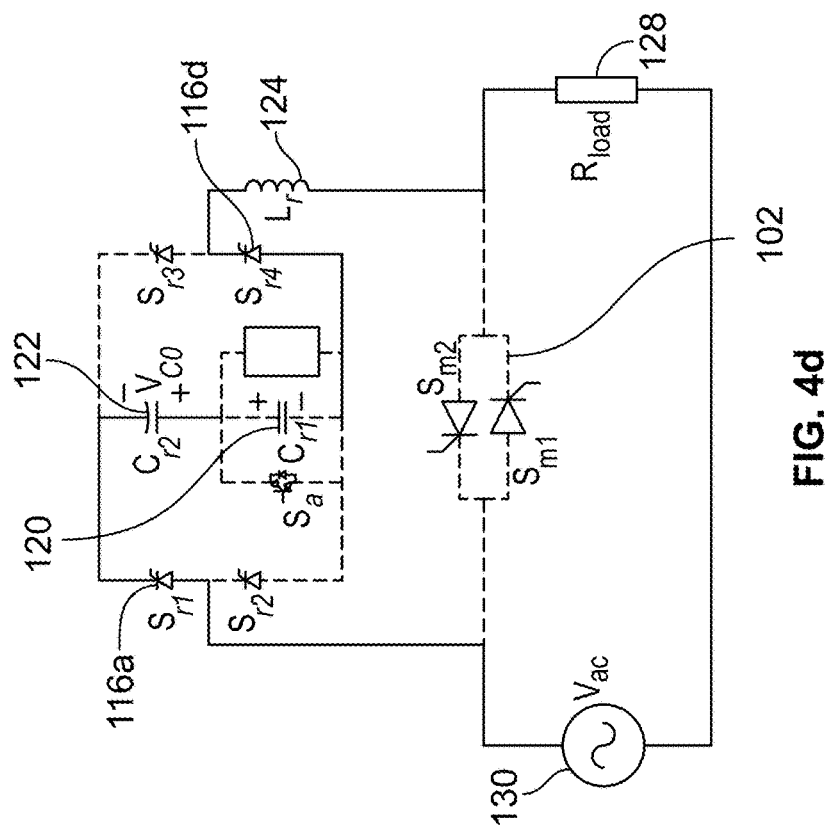
Figure 4C:
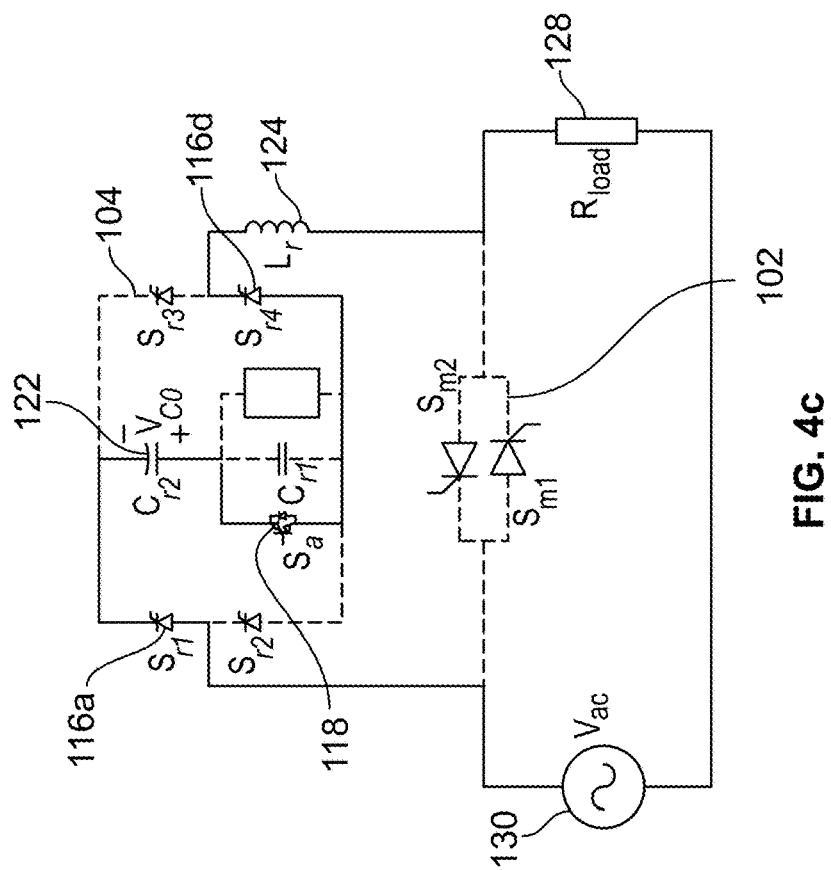
Figure 4F:
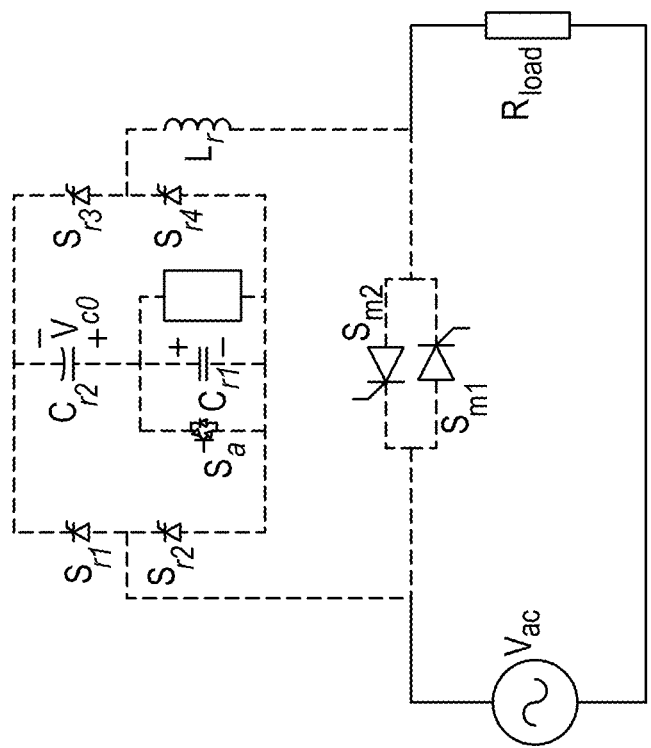

FIGS. 3-4f illustrate exemplary operation of an embodiment of the thyristor current interrupter 100. Solid lines in the circuit shown in FIGS. 4a-4f are intended to illustrate current flow in the main thyristor 102 and the auxiliary turn-off unit 104, while broken lines are representing paths along which current is not passing through the main thyristor 102 and the auxiliary turn-off unit 104. As shown in FIGS. 3 and 4a, during the initial time period T0 (FIG. 3), which can correspond to normal operating conditions during which the thyristor current interrupter 100 is in the closed state, one of the first and second main thyristor switches 114a, 114b ($S_{m1}$, $S_{m2}$) of the main thyristor 102 conducts the load current to a load resistor 128 ($R_{load}$). Which of the first and second main thyristor switches 114a, 114b ($S_{m1}$, $S_{m2}$) is conducting the load current can be based on a variety of criteria, including, for example, the load current direction. Moreover, as shown in FIG. 4a, in the illustrated example, during initial time period T0, the first main thyristor switch 114a of the main thyristor 102 conducts the load current while the auxiliary turn-off unit 104 is in an open condition. Thus, as shown in FIG. 3, during initial time period T0, current is not passing through the auxiliary thyristor switches 116a-d ($S_{r1}$, $S_{r2}$, $S_{r3}$, $S_{r4}$) of the auxiliary turn-off unit 104.

The initial time period T0 can continue during normal operating conditions, and moreover, until a power quality event, such as, for example, a short circuit or an adverse change in the supply or quality of supplied power, occurs that triggers operation of the thyristor current interrupter 100 in a manner that seeks to attain current interruption. However, upon occurrence of a power quality event, such as, for example, as detected by the controller 112 through information from the sensor 110, then at time T1 (FIG. 3) the turn off procedure for the thyristor current interrupter 100 can begin. Thus, at time T1 at least some of the auxiliary thyristor switches 116a-d ($S_{r1}$, $S_{r2}$, $S_{r1}$, $S_{r4}$) of the auxiliary turn-off unit 104, as well as the auxiliary IGBT switch 118, can be turned on, such as, for example, via operation of the controller 112. Which of the auxiliary thyristor switches 116a-d ($S_{r1}$, $S_{r2}$, $S_{r1}$, $S_{r4}$) are turned on at time T1 can depend on a variety of factors, such as, for example, the load current direction, as detected, for example, by a current sensor 110, and/or which of the first and second main thyristor switches 114a, 114b ($S_{m1}$, $S_{m2}$) of the main thyristor 102 is conducting the load current.

In the illustrated example shown in FIG. 4b, at time T1, the first and fourth auxiliary thyristor switches 116a, 116d ($S_{r1}$, $S_{r4}$) are, in addition to the auxiliary IGBT switch 118, turned on, such as, for example via operation of the controller 112, while current is passing through the first main thyristor switch 114a ($S_{m1}$) of the main thyristor 102. By turning on the first auxiliary thyristor switch 116a ($S_{r1}$), the fourth auxiliary thyristor switch 116d ($S_{r4}$), and the auxiliary IGBT switch 118, current can be commutated from the first main thyristor switch 114a ($S_{m1}$) of the main thyristor 102 to the first auxiliary thyristor switch 116a ($S_{r1}$), the auxiliary IGBT switch 118, and the fourth auxiliary thyristor switch 116d ($S_{r4}$), as shown in FIG. 4b. Thus, as shown in FIG. 3, at time T1, as current is being commutated from the first main thyristor switch 114a ($S_{m1}$) of the main thyristor 102, the current level in the first main thyristor switch 114a ($S_{m1}$) of the main thyristor 102 is decreasing while the current level in the auxiliary turn-off unit 104, and more specifically, in the first and fourth auxiliary thyristor switches 116a, 116d ($S_{r1}$, $S_{r4}$), increases.

Further, during time period T1, the resonance can start between the second, low voltage resonant capacitor 122 ($C_{r2}$) and the resonant inductor 124 ($L_r$). As the second, low voltage resonant capacitor 122 can be pre-charged to an initial voltage ($V_{co}$) with the polarity shown in FIG. 4b, and with the main thyristor 102 on, the resonant current can flow through the first auxiliary thyristor switch 116a ($S_{r1}$), the second, low voltage resonant capacitor 122 ($C_{r2}$), the auxiliary IGBT switch 118, the fourth auxiliary thyristor switch 116d ($S_{r4}$), and the resonant inductor 124. As previously mentioned, according to such an embodiment, the resonant inductor 124 can limit the current rise rate (di/dt) of the resonant current so as to ensure a soft commutation. Additionally, as the load current remains unchanged during time period T1, an increase of the resonant current will reduce the current passing through the main thyristor 102, and will thus create the zero current crossing in the first main thyristor switch 114a ($S_{m1}$) of the main thyristor 102.

During time period T1, a reverse recovery current can also be associated with the main thyristor 102. For example, each of the first and second main thyristor switches 114a, 114b ($S_{m1}$, $S_{m2}$) of the main thyristor 102 may have three p-n junctions. In the illustrated example in which the first main thyristor switch 114a ($S_{m1}$) is active, carriers within two of these three p-n junctions inside the first main thyristor switch 114a ($S_{m1}$) can be swept out by a negative current spike. However, while carriers within two of the three p-n junctions may be swept out, carrier charges may still be trapped in the other p-n junction. Thus, at the end of time period T1, while the first main thyristor switch 114a ($S_{m1}$) can stop conducting current, and the load current can instead be commutated to the auxiliary turn-off unit 104, the presence of carrier charges trapped in the other p-n junction can prevent the first main thyristor switch 114a ($S_{m1}$) from being ready to block forward voltage.

The trapped charges in the p-n junction of the first main thyristor switch 114a ($S_{m1}$) can be removed by recombination. However, additional reverse bias time may be needed to allow the first main thyristor switch 114a ($S_{m1}$), and thus the main thyristor 102, to fully turn off. Therefore, the time period T2 can be used to allow the first main thyristor switch 114a ($S_{m1}$) time to finish carrier recombination. During time period T2, the full load current flows through the first auxiliary thyristor switch 116a ($S_{r1}$), the second, low voltage resonant capacitor 122 ($C_{r2}$), the auxiliary IGBT switch 118, the fourth auxiliary thyristor switch 116d ($S_{r4}$), and the resonant inductor 124. Thus, at time period T2, the load current has been commutated from the first main thyristor switch 114a ($S_{m1}$) of the main thyristor 102 such that there is no load current passing through the first main thyristor switch 114a ($S_{m1}$) of the main thyristor 102, as may be needed, among other requirements, for the first main thyristor switch 114a ($S_{m1}$) to be turned off.

Additionally, during time period T2, the load resistor 128 ($R_{load}$) can receive power source voltage, as well as receive extra voltage that is imposed by the second, low voltage resonant capacitor 122 ($C_{r2}$). The extra voltage however provided by the second, low voltage resonant capacitor 122 ($C_{r2}$) can be relatively low compared to the voltage provided by the power source 130. For example, according to certain embodiment, the pre-charge voltage ($V_{co}$), which can be provided to the second, low voltage resonant capacitor 122 ($C_{r2}$) by another circuit, can be around 20 volts (V) to around 50 volts, while the power source voltage may be in the range of hundreds of volts. As the result, the load resistor 128 ($R_{load}$) will only see a minor voltage increase or spike stress.

In the meanwhile, with the first and fourth auxiliary thyristor switches 116a, 116d ($S_{R1}$, $S_{R4}$) being activated, the second, low voltage resonant capacitor 122 ($C_{r2}$) can apply the voltage ($V_{co}$), as shown in FIG. 4c, to reversely bias the first main thyristor switch 114a ($S_{m1}$) of the main thyristor 102 such that the main thyristor 102 has enough time to finish recombination. The voltage provided by the second, low voltage resonant capacitor 122 ($C_{r2}$) can be a negative voltage that is applied to the first main thyristor switch 114a ($S_{m1}$) of the main thyristor 102 while zero current is passing through the first main thyristor switch 114a ($S_{m1}$) of the main thyristor 102. With the current of the first main thyristor switch 114a ($S_{m1}$) at zero, and with a negative voltage being applied to the first main thyristor switch 114a ($S_{m1}$), the controller can turn the gate of the first main thyristor switch 114a ($S_{m1}$) off in time period T1, and the main thyristor 102 is then turned off in time period T2.

The duration of the T2 time period can be controlled by operation of the auxiliary IGBT switch 118 ($S_a$). Additionally, the duration of the time period T2 can be adjusted according to the recombination requirements of different thyristors of the main thyristor 102. Thus, for example, according to certain embodiments, an extra time duration margin can be added to the duration of time period T2 so as to extend the duration of time allotted for the main thyristor to complete recombination. Such an approach can therefore provide a reliable and flexible means to turn off the main thyristor(s) 102. Additionally, during time period T2, the load current discharge of the second, low voltage resonant capacitor 122 ($C_{r2}$), and the associated capacitance, can be large enough to maintain the voltage polarity and reverse bias to first main thyristor switch 114a ($S_{m1}$) of the main thyristor 102. As indicated by FIG. 4d, at the end of the time period T2, the first main thyristor switch 114a ($S_{m1}$) of the main thyristor 102 can be ready to block forward voltage.

As indicated by FIGS. 3 and 4d, during time period T3, current has been commutated to the first, high voltage resonant capacitor 120 ($C_{r1}$), which is in parallel with auxiliary IGBT switch 118 ($S_a$), and the second resonance can start, thereby beginning the process of removing current from the first and fourth auxiliary thyristor switches 116a, 116d ($S_{r1}$, $S_{r4}$). As indicated by FIG. 4d, during the second resonance during time period T3, with the ICBT 118 off, the resonant current can flow through the power source 130, the first auxiliary thyristor switch 116a ($S_{r1}$), the second, low voltage resonant capacitor 122 ($C_{r2}$), the first, high voltage resonant capacitor 120 ($C_{r1}$),—the fourth auxiliary thyristor switch 116d ($S_{r4}$), the resonant inductor 124, and the load resistor 128 ($R_{load}$). The capacitance of the first, high voltage resonant capacitor 120 ($C_{r1}$) can be relatively low such that the voltage of the first, high voltage resonant capacitor 120 ($C_{r1}$) can increase quickly to interrupt the load current. Moreover, the first, high voltage resonant capacitor 120 ($C_{r1}$) can both create zero-voltage turn-off, and minimize turn-off power loss of, the auxiliary IGBT switch 118.

The first, high voltage resonant capacitor 120 ($C_{r1}$) can also reduce the forward blocking voltage increase rate (dv/dt) of the first main thyristor switch 114a ($S_{m1}$) of the main thyristor 102. Such reduction of the forward blocking voltage increase rate (dv/dt) by the first, high voltage resonant capacitor 120 ($C_{r1}$) can, at least during time period T3, prevent the voltage from rising to a rate that could trigger the first main thyristor switch 114a ($S_{m1}$) of the main thyristor 102 to turn on again, which, if allowed to be triggered back on, would result in the thyristor current interrupter 100 failing to interrupt the load current.

Figure 4E:
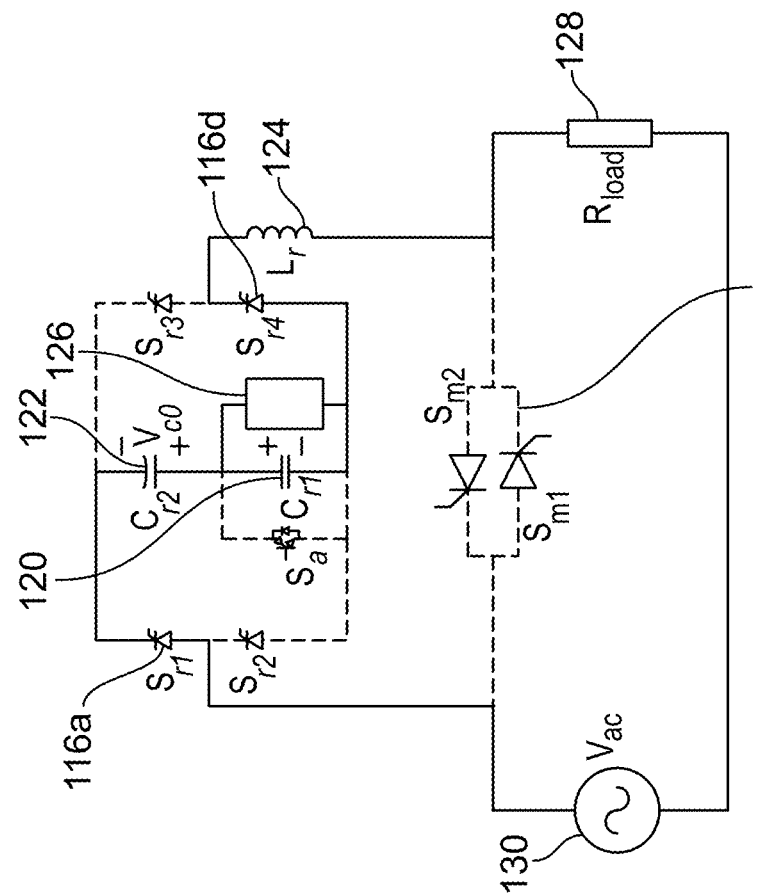

In at least certain situations, if the load current is high, at the end of time period T3, the voltage across the first, high voltage resonant capacitor 120 ($C_{r1}$) may reach the threshold voltage set by the voltage-clamping circuit. Thus, during period T4 (FIG. 3), as indicated by FIG. 4e, upon the voltage across the first, high voltage resonant capacitor 120 ($C_{r1}$) reaching the threshold voltage, such as, for example, a maximum voltage, the voltage-clamping unit 126 can be activated. The voltage established across the first, high voltage resonant capacitor 120 ($C_{r1}$) can be eventually larger than the power source voltage such that the load current can be decreased to zero by the auxiliary turn-off unit 104. Additionally, the clamped voltage of the voltage-clamping unit 126 may be larger than the voltage of the power source 130 that is providing power through the thyristor current interrupter 100.

When activated, the voltage-clamping unit 126 can have a relatively low impedance so that the load current in the auxiliary turn-off unit 104 is conducted through the voltage-clamping unit 126. As the load current is conducted through the voltage-clamping unit 126, the voltage-clamping unit 126 can absorb the associated energy, and thereby reduce the load current passing through the auxiliary turn-off unit 104 until the load current passing through the auxiliary first and fourth auxiliary thyristor switches 116a, 116d ($S_{r1}$, $S_{r4}$) hits the zero current crossing. After the load current hits the zero current crossing, the resonant current can be interrupted after a brief reverse recovery current of the first auxiliary thyristor switch 116a ($S_{r1}$) and the fourth auxiliary thyristor switch 116d ($S_{r4}$).

Referencing FIGS. 3 and 4f, at time period T5, the load current has already been interrupted, and the first main thyristor switch 114a ($S_{m1}$) of the main thyristor 102 has withstood the voltage of the power source 130. Since the voltage across the first, high voltage resonant capacitor 120 ($C_{r1}$) is larger than the sum of the voltage of the power source 130 and the residual voltage of the second, low voltage resonant capacitor 122 ($C_{r2}$), the first, high voltage resonant capacitor 120 ($C_{r1}$) can provide a reverse biasing voltage for the first and fourth auxiliary thyristor switches 116a, 116d ($S_{r1}$, $S_{r4}$). The internal carrier charges of the first and fourth auxiliary thyristor switches 116a, 116d ($S_{r1}$, $S_{r4}$) can then be recombined to ensure that the first and fourth auxiliary thyristor switches 116a, 116d ($S_{r1}$, $S_{r4}$) can be fully turned off. As also indicated by FIG. 4f, at time T6 (FIG. 3), full current interruption is complete, and the load resistor 128 is disconnected by the thyristor current interrupter 100 from the power source 130. The total turn-off time of the thyristor current interrupter 100 from the time of activation of the auxiliary turn-off unit (time period T1), until the load is disconnected from the power source 130 by the thyristor current interrupter 100 at time period T6 can be, for example, around 350 microseconds.

The above example is discussed and illustrated in FIGS. 3-4f in terms of a single phase alternating current power source 130. Moreover, the example discussed above and illustrated in FIGS. 3-4f depict a power event situation that occurs during a half cycle at which current is passing through the first main thyristor switch 114a ($S_{m1}$) of the main thyristor 102, and which thus results in activation of the first and fourth auxiliary thyristors 116a, 116d ($S_{r1}$, $S_{r4}$) of the auxiliary turn-off unit 104. However, in other situations, the power event could occur during a half cycle in which the current is instead passing through the second main thyristor switch 114b ($S_{m2}$) of the main thyristor 102, which would thus instead result in activation of the second and third auxiliary thyristor switches 116b, 116c ($S_{r2}$, $S_{r1}$) of the auxiliary turn-off unit 104. Thus, while the above discussions relate to a situation involving current flow through the first main thyristor switch 114a ($S_{m1}$) of the main thyristor 102 and the associated activation of the first and fourth auxiliary thyristor switches 116a, 116d ($S_{r1}$, $S_{r4}$) of the auxiliary turn-off unit 104, the discussions and illustrations can similarly be applicable to situations occurring when current is flowing through the second main thyristor switch 114b ($S_{m2}$) of the main thyristor 102 and the associated activation of the second and third auxiliary thyristor switches 116b, 116c ($S_{r2}$, $S_{r1}$) of the auxiliary turn-off unit 104. The above example is applicable to both uni-directional and bi-directional current systems that can utilize other types of power, including, but not limited to, direct current, as well as multi-phase current applications.

Additionally, according to other applications, instead of having both first and second main thyristor switches 114a, 114b ($S_{m1}$, $S_{m1}$), as illustrated in at least FIG. 2, the main thyristor 102 may only include a single main thyristor switch 114a ($S_{m1}$). According to such an embodiment, rather than having a pair of auxiliary thyristors, as also illustrated in at least FIG. 2, the auxiliary turn-off unit 104 may include only a single pair of auxiliary thyristors, such as, for example, the illustrated first and fourth auxiliary thyristors 116a, 116d ($S_{r1}$, $S_{r4}$).

Figure 5:
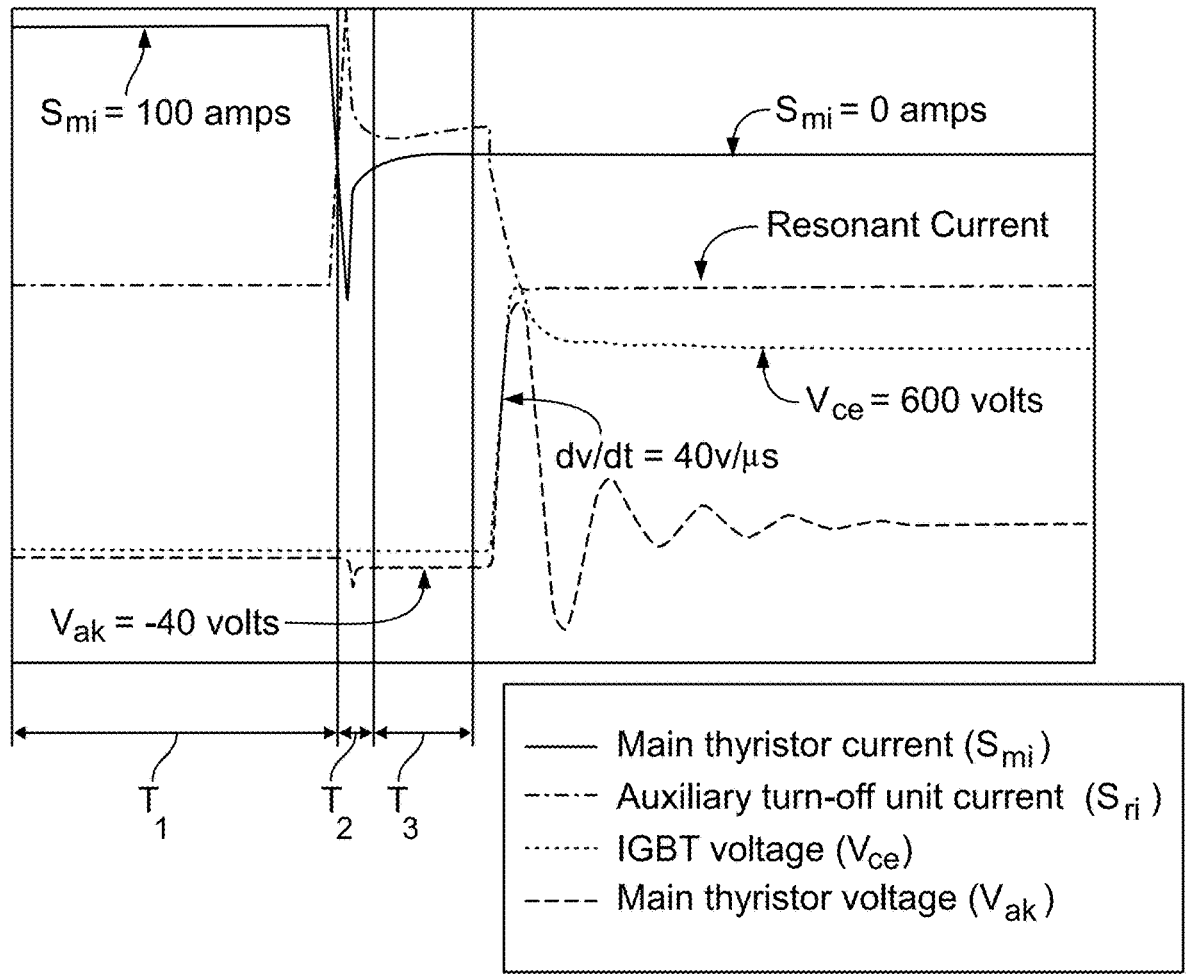
FIG. 5 illustrates a graphical representation of results of an exemplary current interruption by a thyristor current interrupter switch according to an illustrated embodiment of the subject application.

FIG. 5 illustrates a graphical representation of results of an exemplary current interruption by a thyristor current interrupter 100 according to an illustrated embodiment of the subject application. In this illustrated example, the voltage of the power source is 100V DC, the resistance of the load resistor 128 ($R_{load}$) is one Ohm, the second, low voltage resonant capacitor 122 ($C_{r2}$) is pre-charged to 40 volts, and the main thyristor 102 conducts 100 amps load current. As previously discussed, activating the auxiliary turn-off unit 104, such as, for example, via switching on the first and fourth auxiliary thyristor switches 116a, 116d ($S_{r1}$, $S_{r4}$) and the IGBT switch 118 ($S_a$), can initiate the current interruption process. In FIG. 5, the commencement of the current interruption process, and the corresponding current commutation from main thyristor current of the main thyristor 102 to the auxiliary turn-off unit 104 can be seen as commencing at a first time period ("$T_1$" in FIG. 5), and extending into a second time period ("$T_2$" in FIG. 5). Further, following conclusion of the current commutation from main thyristor 102, a reverse recovery process for the main thyristor 102 can occur during the second time period ($T_2$). As discussed above, after reverse recovery of the main thyristor 102, a reverse bias voltage, such as, for example, a negative voltage of about 40 volts, can be applied to the main thyristor 102. The main thyristor current can then stop, and an internal recombination process of the main thyristor 102 can begin, as indicated during a third time period ("$T_3$" in FIG. 5). According to certain embodiments, the reverse recovery and the internal recombination process can take about 130 microseconds. Further, the IGBT switch 118 can be turned on during, as well as for a period of time before and/or after reverse recovery and the internal recombination process of the main thyristor 102. For example, according to certain embodiments, while the reverse recovery and the internal recombination process can take about 130 microseconds, the IGBT switch 118 can be turned on for about 150 microseconds. Moreover, the turn-on time of the IGBT switch 118 can be adjustable so as to ensure that the main thyristor 102 finishes reverse recovery and the internal recombination process before the IGBT switch 118 is turned off so as to at least attempt to ensure that the main thyristor 102 is ready to block forward voltage.

As indicated in FIG. 5, after the IGBT switch 118 is turned off, the rate of rise of voltage (dv/dt) for the voltage of the main thyristor 102 can be limited to 40V/µs, which can be relatively far below a false trigger value that could retrigger the main thyristor 102 to turn on. Further, following the IGBT switch 118 being turned off, the voltage of the main thyristor 102 can grow larger than the voltage of the power source, which can reduce the load current to zero.

After the first and fourth auxiliary thyristor switches 116a, 116d ($S_{r1}$, $S_{r4}$) of the auxiliary turn-off unit 104 are turned off, and a full quasi-resonant turn-off operation completes, the main thyristor 102 can successfully block or interrupt the 100V system voltage. According to certain embodiments, the total current interruption time attained by operation of the thyristor current interrupter 100 under such circumstances can be around 300 microseconds (µs).

Figure 6:
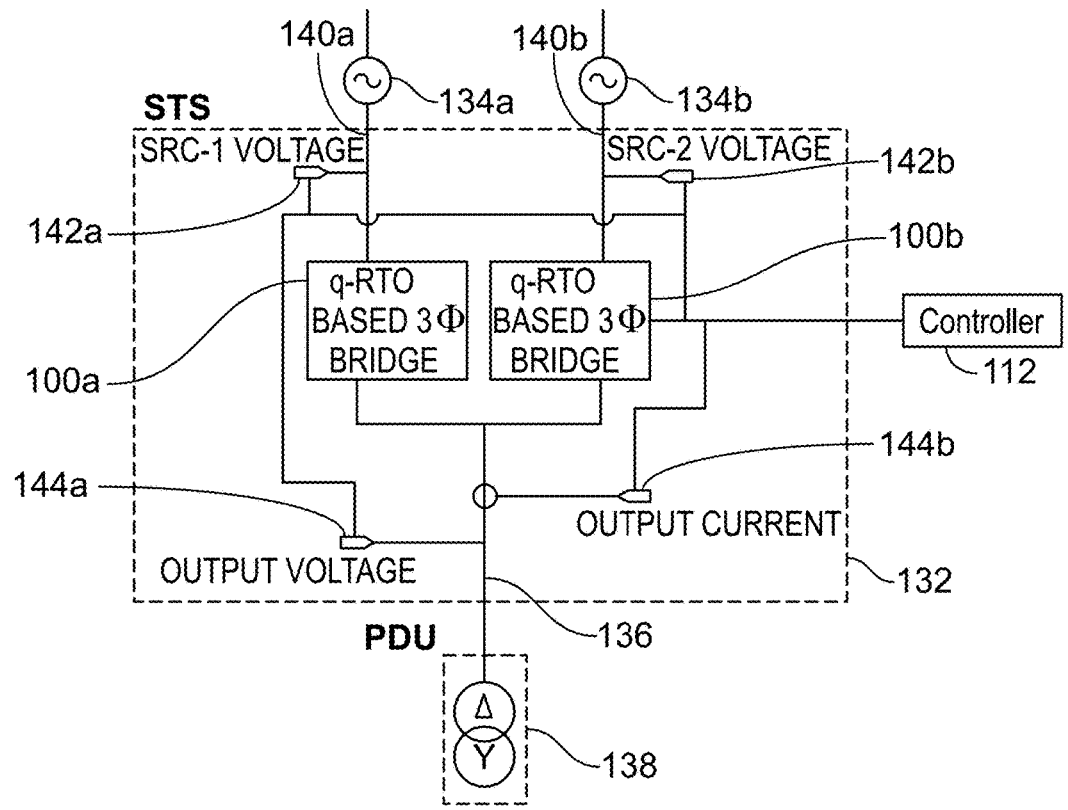
FIG. 6 illustrates a block diagram of a static transfer switch ("STS") having multiple thyristor current interrupter switches according to an illustrated embodiment of the subject application.

According to embodiments, the thyristor current interrupter 100 can also be used in connection with a transfer switch. In such embodiments, the inclusion of the auxiliary turn-off unit 104 can decrease the transfer time associated with a switch to a different power source. For example, FIG. 6 illustrates a block diagram of a three-phase static transfer switch 132 ("STS") having multiple thyristor current interrupters 100a, 100b ("q-RTO") according to an illustrated embodiment of the subject application. Each of the thyristor current interrupters 100a, 100b can have a construction that is similar to the thyristor current interrupter 100 that is depicted in FIG. 2, but can be modified to accommodate three-phase current, as previously discussed. Additionally, as shown, according to the illustrated embodiment, a first thyristor current interrupter 100a of the static transfer switch 132 can be electrically coupled to a first power source 134a, and a second thyristor current interrupter 100b of the static transfer switch 132 can be electrically coupled to a second power source 134b. Additionally, the first power source 134a and the second power source 134b can be different power sources. For example, according to certain embodiments, the first power source 134a can be a utility or grid power source, while the second power source can be an auxiliary or backup power source, such as, for example, a power source provided by a battery and/or generator, among other types of power sources. According to certain embodiments, such a static transfer switch 132 can be utilized in at least certain critical circumstances in which the load is to be relatively continuously supplied with electrical power. For example, according to certain embodiments, the output line 136 of the static transfer switch 132 can be coupled to a power distribution unit 138 (PDU), including, for example, a delta-to-wye transformer, that can be coupled to a data center, telecommunication center, and/or a plurality of databases or servers, among other components.

According to the exemplary static transfer switch 132 shown in FIG. 6, the first thyristor current interrupter 100a can be electrically coupled to the first power source 134a by a first input line 140a, and the second thyristor current interrupter 100b can be electrically coupled to the second power source 134b by a second input line 140b. Additionally, each of the first and second input lines 140a, 140b can be connected to an associated input side sensor 142a, 142b, such as, for example, a voltage sensor. The input side sensors 142a, 142b can each be communicatively coupled to a controller 112 such that information detected by the input side sensors 142a, 142b can be communication to the controller 112. Additionally, the first and second thyristor current interrupters 100a, 100b can be coupled to the output line 136 of the static transfer switch 132. Additionally, one or more output side sensors 144a, 144b, such as, for example, an output current sensor and/or an output voltage sensor, can be coupled to the output line 136, as well as communicatively coupled to the controller 112.

According to such an embodiment, during normal operation, the first thyristor current interrupter 100a of the static transfer switch 132 can be operated, such as, for example, closed, such that electrical power can be supplied by the first power source 134a to the load side of the static transfer switch 132 via the output line 136, while the second thyristor current interrupter 100b is inactive, such as, for example, in an opened state, such that power from the second power source 134b is not supplied to the load side of the static transfer switch 132. The controller 112 can monitor at least the one or more input side sensors 142a, 142b and/or the one or more output side sensors 144a, 144b in connection with detection of a power event, such as, for example, a loss in the supply of power from the first power source 134a, or an issue with the quality of the power being supplied by at least the first power source 134a, among other power events that may render the power, if any, of the first power source 134a unacceptable for the associated load. Upon detection of such a power event, the controller 112 can, for each phase, commence operation of the auxiliary turn-off unit 104 of the first thyristor current interrupter 100a so as to accelerate the turning off of the associated main thyristor 102 in a manner that may be similar to the example discussed above with respect to at least FIGS. 3-4f. The controller 112 can then commence operation of the second thyristor current interrupter 100b, such as, for example, closing the second thyristor current interrupter 100b such that power from the second power source 134b can then be outputted from the static transfer switch 132.

By accelerating the speed at which the first thyristor current interrupter 100a can be turned off via operation of the corresponding auxiliary turn-off unit 104, the duration of the transfer time associated with the static transfer switch 132 toggling between outputting power from the first power source 134a to outputting power from the second power source 134b, via operation of the second thyristor current interrupter 100b, can be decreased. Such a decrease in transfer time can have a number of benefits, including, for example, reducing the duration of time that electrical power is not being supplied to the load from either the first power source 134a or the second power source 134b during the transfer, reduce the downstream impact or potential damage associated with an interruption in power supply to the load, and/or reduce the size and cost of one or more capacitors of the downstream load that may otherwise be sized to provide sufficient power to the load during the duration of the transfer from the first power source 134a to the second power source 134b.

Following the turning off of the first thyristor current interrupter 100a, and while power from the second power source 134b is being outputted from the static transfer switch 132, the controller 112 can continue to monitor the quality and/or availability of power from the first power source 134a. Upon determining that power is available, and/or is of sufficient quality, from the first power source 134a, the controller 112 can similarly commence operation of the auxiliary turn-off unit 104 of the second thyristor current interrupter 100b so as to accelerate the turning off of the associated main thyristor 102 of the second thyristor current interrupter 100b in a manner that may also be similar to the example discussed above with respect to at least FIGS. 3-4f. The controller 112 can then commence operation of the first thyristor current interrupter 100a, such as, for example, closing the first thyristor current interrupter 100a, such that power from the first power source 134a can again be outputted through the static transfer switch 132.

Figure 7:
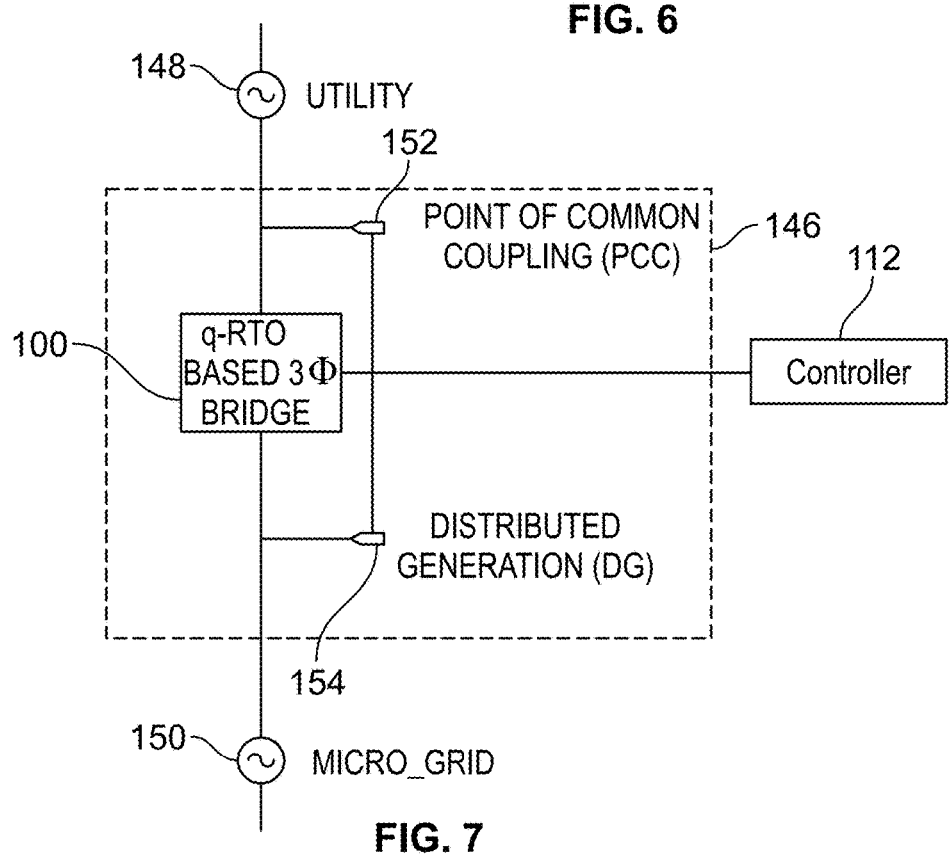
FIG. 7 illustrates a block diagram of an exemplary thyristor current interrupter switch according to an illustrated embodiment of the subject application used in connection with a micro-grid disconnect switch.

FIG. 7 illustrates a block diagram of an exemplary thyristor current interrupter 100 according to an illustrated embodiment of the subject application used in connection with a micro-grid disconnect switch 146. Similar to each of the first and second thyristor current interrupters 100a, 100b in FIG. 6, the thyristor current interrupter 100 in the example provided in FIG. 7 is also configured for use in a three-phase current application. As shown, at least when used as a micro-grid disconnect switch 146, the thyristor current interrupter 100 can be connected to a utility power source 148 at a point of common-coupling 152 (PCC), and to a micro-grid 150 via, for example, a distributed generation ("DG") system 154. According to certain embodiments, utilizing the thyristor current interrupter 100 of the subject application in connection with a micro-grid disconnect switch 146 can result in the main thyristor 102 of the thyristor current interrupter 100 isolating the micro-grid 150 from the utility power source 148 at a speed that can be around 20 times faster than traditional thyristor based micro-grid disconnect switches.

Figure 8:
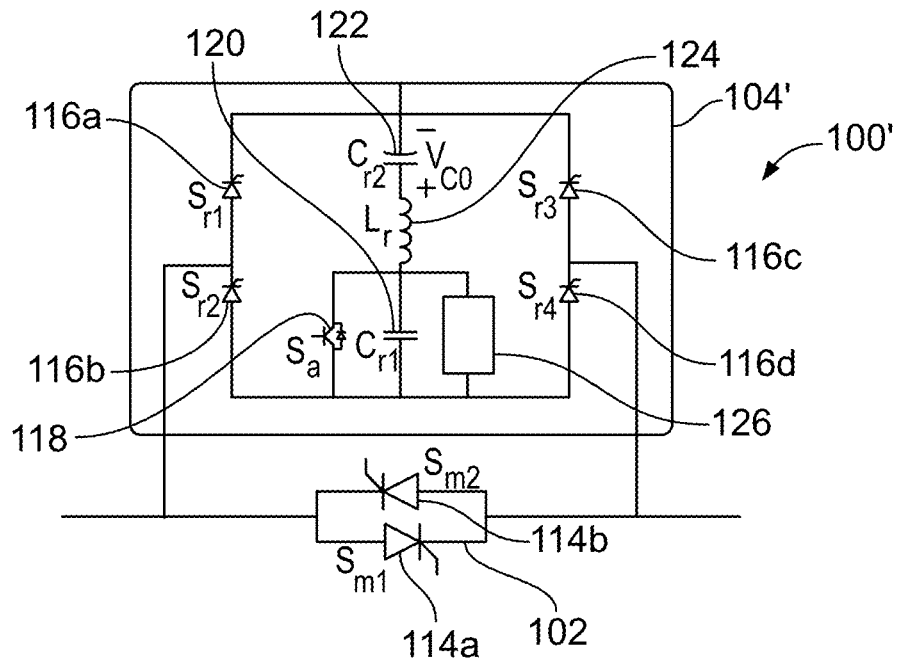
FIGS. 8-10 illustrate block diagrams of exemplary variations in the configuration of the auxiliary turn-off unit for a thyristor current interrupter switch of the subject application.
Figure 9:
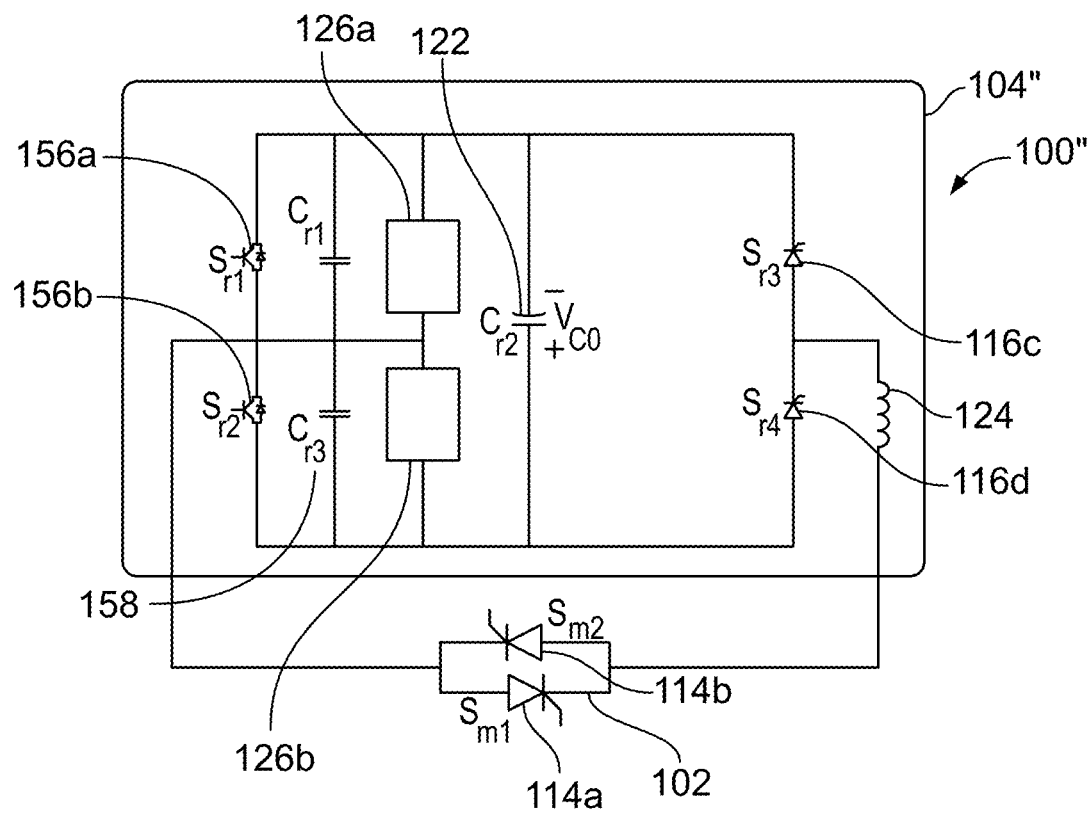
Figure 10:
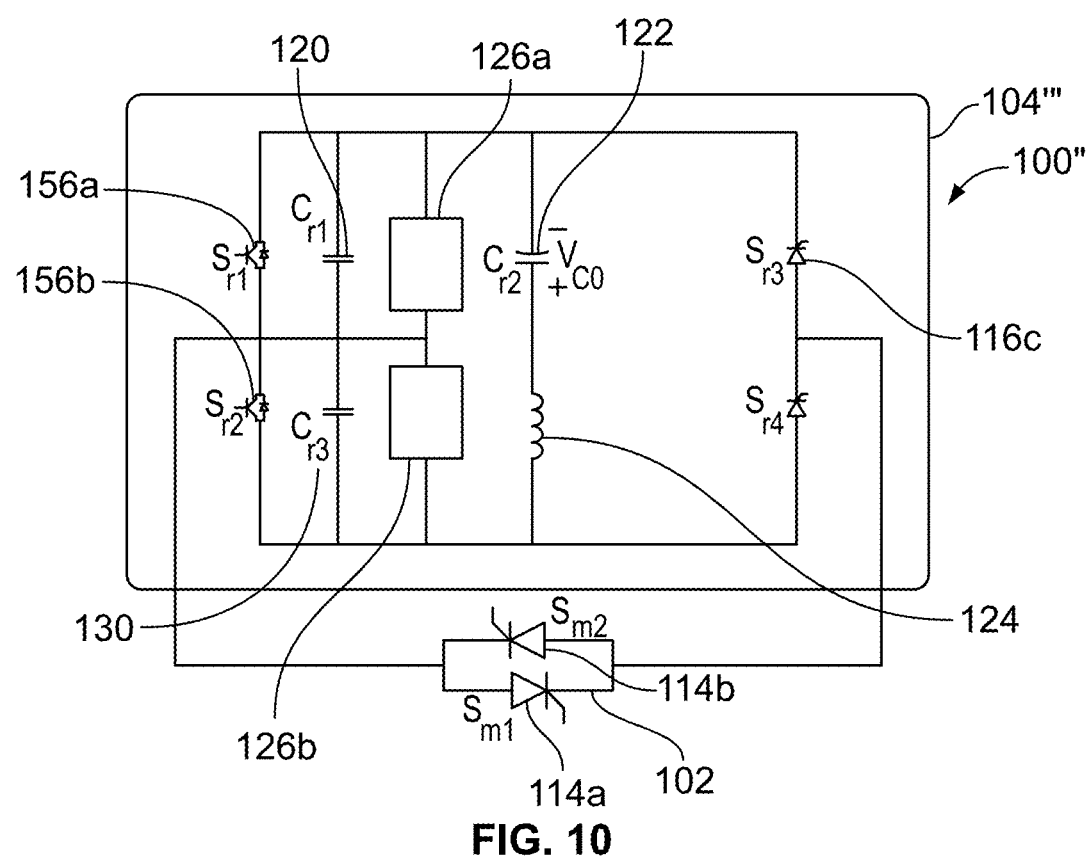

FIGS. 8-10 illustrate block diagrams of exemplary variations in the configuration of the auxiliary turn-off unit 104', 104", 104''' for the thyristor current interrupter 100', 100", 100''' of the subject application. For example, the auxiliary turn-off unit 104' shown in FIG. 8 is similar to the auxiliary turn-off unit 104 described above with respect to at least FIG. 2 with exception that unlike FIG. 2 in which the resonant inductor 124 ($L_r$) located outside the thyristor bridge, the resonant inductor 124 ($L_r$) in the embodiment shown in FIG. 8 is located inside the thyristor bridge and in series with the second, low voltage capacitor ($C_{r2}$). However, the operational principals of the auxiliary turn-off unit 104 of FIG. 2 and the auxiliary turn-off unit 104' can be the same.

With respect to the auxiliary turn-off unit 104" shown in FIG. 9, unlike the auxiliary turn-off unit 104 of FIG. 2 that includes one auxiliary semiconductor switch 118, such as, for example, the illustrated IGBT ($S_a$) and four auxiliary thyristor switches 116a-d ($S_{r1}$-$S_{r4}$), for a total of 5 switches, the auxiliary turn-off unit 104" shown in FIG. 9 has two auxiliary semiconductor switches 156a, 156b ($S_{r1}$, $S_{r2}$) and two auxiliary thyristor switches 116c, 116d ($S_{r3}$, $S_{r4}$), for a total of four switches. Further, while the embodiment depicted in FIG. 9 illustrates, and is discussed below in terms of use of, IGBTs for the two auxiliary semiconductor switches 156a, 156b, a variety of other types of semiconductor switches can also, including, but not limited to, MOSFETs and/or JFETs, among other types of fully-controllable semiconductor switches having full current turn-off capabilities. Further, the first and second auxiliary thyristor switches 116a, 116b ($S_{r1}$, $S_{r2}$) from the embodiment depicted in FIG. 2 are each replaced in the embodiment depicted in FIG. 9 with an IGBT switch 156a, 156b. The inclusion of the two additional IGBT switches 156a, 156b ($S_{r1}$, $S_{r2}$), among other types of semiconductor switches, in the embodiment shown in FIG. 9 can, when compared to at least the use of thyristor switches, improve the speed of turning off of the thyristor current interrupter 100, as the IGBTs 156a, 156b can be turned off via a signal from the controller 112 rather than waiting or a current zero crossing, as is associated with the use of thyristor switches. As also seen in FIG. 9, the auxiliary turn-off unit 104" can further include a third capacitor 158, and the voltage-clamping unit 126 can comprise a pair of voltage-clamping units 126a, 126b.

Turning to FIG. 10, FIG. 10 depicts an auxiliary turn-off unit 104''' similar to a combination of the auxiliary turn-off units 104', 104" discussed above with respect to FIGS. 8 and 9. Thus, similar to the auxiliary turn-off unit 104" shown in FIG. 9, the auxiliary turn-off unit 104''' shown in FIG. 10 also includes first and second auxiliary semiconductor switches having current turn-off capabilities, such as, for example, IGBT switches 156a, 156b ($S_{r1}$, $S_{r2}$), among other types of semiconductor switches, in lieu of first and second auxiliary thyristor switches 116a, 116b, as well as two auxiliary thyristor switches 116c, 116d ($S_{r3}$, $S_{r4}$), for a total of four switches. Thus, the auxiliary turn-off unit 104''' may have the same benefits of the auxiliary turn-off unit 104" shown in FIG. 9 at least with respect to the speed of turning off of the thyristor current interrupter 100, as the auxiliary IGBT switches 156a, 156b can be turned off via a signal from the controller 112. Additionally, the auxiliary turn-off unit 104''' shown in FIG. 10 also includes the features of the auxiliary turn-off unit 104' shown in FIG. 8 with respect to at least the resonant inductor 124 ($L_r$) located inside the thyristor bridge.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:
1. An apparatus comprising:
a main thyristor comprising at least one main thyristor switch; and
an auxiliary turn-off unit connected in parallel to the main thyristor, the auxiliary turn-off unit comprising one or more pairs of auxiliary switches, a plurality of capacitors, a semiconductor switch, and at least one voltage-clamping unit, each of the one or more pairs of auxiliary switches including at least one auxiliary thyristor switch,
the auxiliary turn-off unit being structured to, upon the semiconductor switch being turned from a switch off state to a switch on state, commutate a load current from the main thyristor to a first pair of auxiliary switches of the one or more pairs of auxiliary switches and the semiconductor switch of the auxiliary turn-off unit, at least one capacitor of the plurality of capacitors being structured and positioned to, following commutation of the load current to the auxiliary turn-off unit, provide a resonant current to create a zero current crossing for the main thyristor to turn the main thyristor from a thyristor on state to a thyristor off state, at least another capacitor of the plurality of capacitors being positioned and structured to, upon the semiconductor switch being turned to the switch off state and with the main thyristor in the thyristor off state, have an increase in a voltage level, and the at least one voltage-clamping unit structured to absorb electrical power from the at least another capacitor at least until the load current passing through the one or more pairs of auxiliary switches is decreased to a level that can turn at least the at least one auxiliary thyristor switch to an off state.

2. The apparatus of claim 1, wherein the auxiliary turn-off unit further includes a resonant inductor, and wherein the auxiliary turn-off unit is structured to limit a rate of current rise as the load current is commutated from the at least one main thyristor switch of the main thyristor to the one or more pairs of auxiliary switches and the semiconductor switch of the auxiliary turn-off unit.

3. The apparatus of claim 2, wherein the auxiliary turn-off unit is structured to, while the load current is being commutated, conduct a resonant current through the one or more pairs of auxiliary switches, the at least one capacitor, the semiconductor switch, and the resonant inductor.

4. The apparatus of claim 1, wherein the at least one capacitor is pre-charged, and wherein the semiconductor switch has current turn-off capability.

5. The apparatus of claim 1, wherein the at least one capacitor is further positioned and structured to provide a reverse bias voltage for the main thyristor to hold the main thyristor in the thyristor off state.

6. The apparatus of claim 1, wherein the at least another capacitor of the plurality of capacitors is structured to, upon the semiconductor switch being turned from the switch on state to the switch off state, limit a rate of voltage change of the main thyristor.

7. The apparatus of claim 1, wherein the at least one voltage-clamping unit comprises a plurality of metal oxide varistors.

8. The apparatus of claim 1, wherein the at least one auxiliary thyristor switch is a first auxiliary thyristor switch, and wherein the first pair of auxiliary switches further comprises a second auxiliary thyristor switch.

9. The apparatus of claim 8, wherein the at least one main thyristor switch comprises a first main thyristor switch and a second main thyristor switch, and wherein the one or more pairs of auxiliary switches further comprises a second pair of auxiliary switches comprising a third auxiliary thyristor switch and a fourth auxiliary thyristor switch.

10. The apparatus of claim 1, wherein the first pair of auxiliary switches comprises the at least one auxiliary thyristor switch and an auxiliary semiconductor switch having current turn-off capabilities.

11. A thyristor current interrupter comprising:
a main thyristor comprising one or more main thyristor switches;
an auxiliary turn-off unit connected in parallel to the main thyristor and having at least a first semiconductor switch, at least one auxiliary thyristor, a first capacitor, and a second capacitor, the auxiliary turn-off unit structured to (1) commutate, upon the first semiconductor switch being turned to an on state, a load current from the main thyristor to the auxiliary turn-off unit, (2) provide a resonant current to create a zero current crossing for the main thyristor, (3) increase, upon the first semiconductor switch and the main thyristor both being turned to an off state, a voltage level of the first capacitor, and (4) decrease, upon the voltage level of the first capacitor reaching a threshold level, the load current in the auxiliary turn-off unit to a level that accommodates turning the at least one auxiliary thyristor to an off state,
wherein the auxiliary turn-off unit includes at least one voltage-clamping unit configured to absorb electrical power from the first capacitor as the load current in the auxiliary turn-off unit is decreased.

12. The thyristor current interrupter of claim 11, wherein the first capacitor is further configured to limit a rate at which voltage is increased in the main thyristor.

13. The thyristor current interrupter of claim 11, wherein a duration of time that the first semiconductor switch is in the on state is adjustable.

14. The thyristor current interrupter of claim 11, wherein the first semiconductor switch is at least one of an insulated gate bipolar transfer (IGBT) switch, a GTO, an IGCT, a BJT, a MOSFET, or a JFET.

15. The thyristor current interrupter of claim 11, wherein the second capacitor is positioned and configured to apply a reverse bias voltage to the main thyristor.

16. The thyristor current interrupter of claim 11, wherein the auxiliary turn-off unit further includes a resonant inductor positioned and structured to limit a rate of rise of current in the auxiliary turn-off unit.

17. A method comprising:
activating a switch and a plurality of auxiliary switches of an auxiliary turn-off unit of a thyristor current interrupter, the plurality of auxiliary switches including at least one auxiliary thyristor switch;
commutating a load current from a main thyristor of the thyristor current interrupter to the auxiliary turn-off unit, the main thyristor including at least one main thyristor switch;
transmitting a resonant current through at least a portion of the auxiliary turn-off unit in a manner that at least decreases the load current passing through the main thyristor;
deactivating a semiconductor switch of the auxiliary turn-off unit;
increasing, after deactivation of the semiconductor switch, a voltage level of a first capacitor of the auxiliary turn-off unit;
absorbing, by one or more voltage-clamping units, an electrical power from the first capacitor;
decreasing, as the one or more voltage-clamping units absorb the electrical power, the load current in the auxiliary turn-off unit; and
deactivating, upon the load current in the auxiliary turn-off unit either being reduced below a holding current or upon a current zero crossing, the at least one auxiliary thyristor switch of the auxiliary turn-off unit.

18. The method of claim 17, wherein the step of activating the semiconductor switch comprises activating at least one of an auxiliary insulated gate bipolar transfer (IGBT) switch, an auxiliary GTO, an auxiliary IGCT, an auxiliary BJT, an auxiliary MOSFET, and an auxiliary JFET of the auxiliary turn-off unit.

19. The method of claim 18, further including the step of applying, from a second capacitor of the auxiliary turn-off unit, a reverse bias voltage to the at least one main thyristor switch.

20. The method of claim 17, wherein the step of deactivating the at least one auxiliary thyristor switch further comprises applying a reverse bias voltage from the first capacitor to the at least one auxiliary thyristor switch.

\* \* \* \* \*